United States Patent [19]

DeBard et al.

[11] 4,068,368
[45] Jan. 17, 1978

[54] CLOSURE FOR SEMICONDUCTOR DEVICE AND METHOD OF CONSTRUCTION

[75] Inventors: James Edward DeBard, Eatontown; Raymond Walter Borden, Farmingdale; John Joseph Tumpey, Oakhurst, all of N.J.

[73] Assignee: The Bendix Corporation, Teterboro, N.J.

[21] Appl. No.: 713,071

[22] Filed: Aug. 9, 1976

Related U.S. Application Data

[62] Division of Ser. No. 621,917, Oct. 14, 1975, abandoned.

[51] Int. Cl.² .............................................. B01J 17/00
[52] U.S. Cl. ....................................... 29/588; 29/589; 357/79
[58] Field of Search ................................... 29/588, 589

[56] References Cited

U.S. PATENT DOCUMENTS

| | | | |
|---|---|---|---|
| 3,192,454 | 6/1965 | Rosenheinrich | 357/79 |
| 3,461,358 | 8/1969 | Lewis | 29/588 |
| 3,480,844 | 11/1969 | Lewis | 357/79 |
| 3,512,249 | 5/1970 | Lewis | 29/588 |

FOREIGN PATENT DOCUMENTS 1,070,092  5/1967  United Kingdom .................. 357/79

Primary Examiner—W. Tupman
Attorney, Agent, or Firm—Anthony F. Cuoco

[57] ABSTRACT

A silicon controlled rectifier has a triangular base with a planar mounting surface and holes at the apices of the angles to receive screws for mounting the rectifier to a heat sink surface. An anode ring having a skirt is threaded to a flange on the base and a semiconductor pellet is positioned on the base within the flange. A spring loaded cathode tube is positioned coaxially within the anode ring in engagement with the semiconductor pellet and a spring loaded gate is positioned coaxially within the cathode tube in engagement with the pellet to pressure mount the pellet on the base. A predetermined torque is applied to the anode ring when assembling it to the base to provide an accurate, predictable load on the pellet.

4 Claims, 7 Drawing Figures

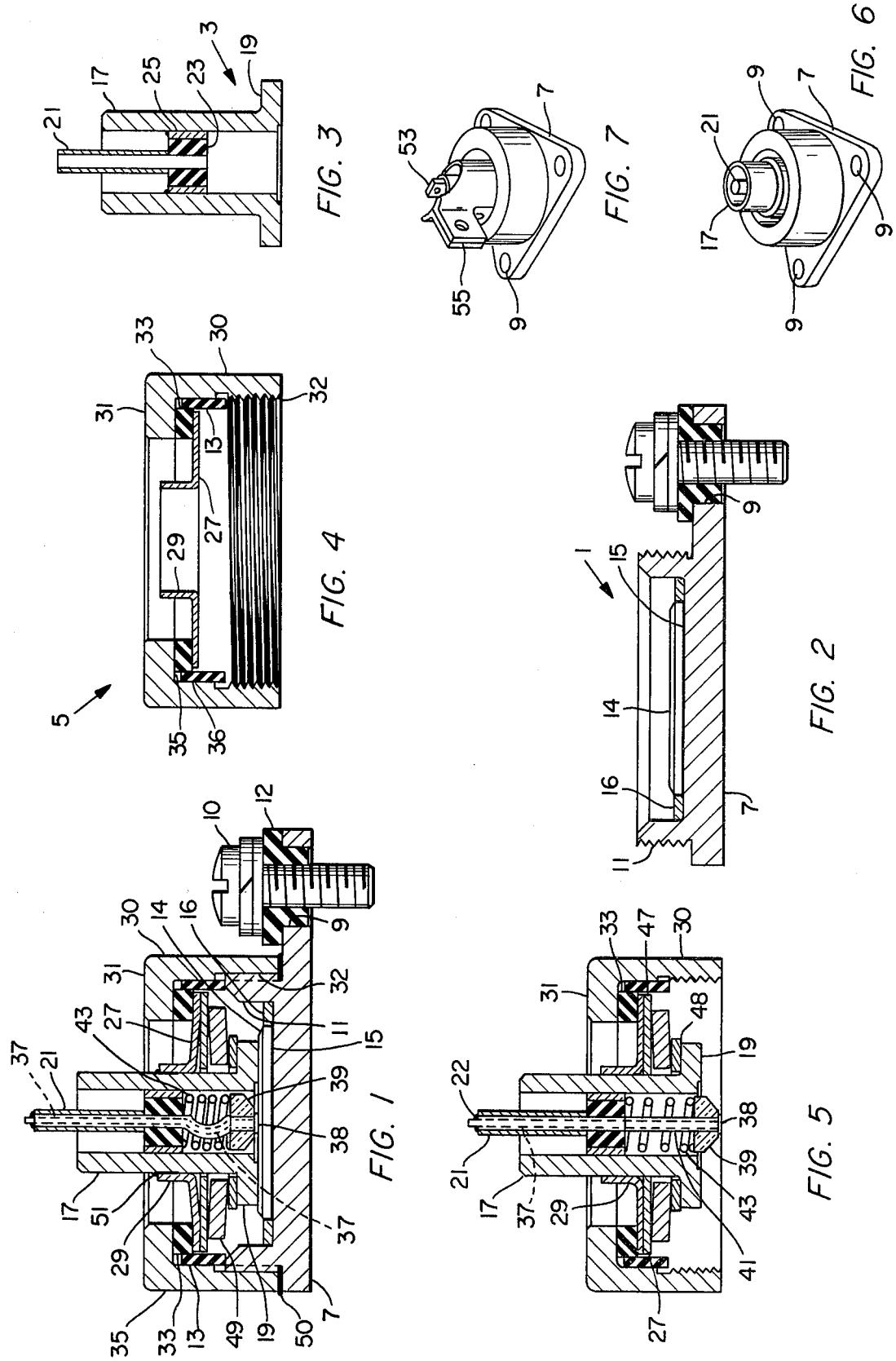

CLOSURE FOR SEMICONDUCTOR DEVICE AND METHOD OF CONSTRUCTION

This is a division of application Ser. No. 621,917, filed Oct. 14, 1975 and now abandoned.

The invention relates to semiconductor devices and more particularly to packaging such devices.

PRIOR ART

Heretofore, semiconductors, such as silicon controlled rectifiers used in powder systems and requiring large current capacity, were packaged with a massive base, a threaded mounting stud of substantial diameter and overly generous insulators. In addition, the control leads were offset and the closures were crimped. These features resulted in excess weight and large size. Heat sinks were ineffective because the semiconductor was mounted on the heat sink by the threaded stud which made only limited contact with the heat sink surface. Crimped closures precluded smooth surface terminations required for use of spring type connectors. The traditional package required the control lead to be offset from a central point of contact on the semiconductor pellet and resulted in additional height.

These disadvantages are overcome by the semiconductor device shown and described in Application Ser. No. 553,778, filed Feb. 27, 1975, now abandoned, and assigned to the same assignee as the present application.

SUMMARY OF THE INVENTION

The main difference between the semiconductor device of the above application and the present invention is that all hermetic seals are soldered instead of welded and the anode ring has a skirt which is threaded to a flange on the base and the anode ring is torqued to a predetermined value.

The present invention has all the advantages of the semiconductor device of the above application and in addition permits an accurate, predictable load to be applied to the semiconductor pellet by the gate and cathode to provide good contact, compensates for deviations in overall height due to manufacturing tolerances and provides for disassembly and repair.

The invention contemplates a semiconductor device comprising a base, a ring-shaped electrode threaded to the base, a semiconductor pellet on the base, at least one spring loaded electrode coaxial with the cylindrical electrode and engaging the pellet to pressure mount the pellet on the base, the ring-shaped electrode being torqued to a predetermined value during assembly to the base so that the spring loaded electrode exerts a predetermined pressure on the pellet. A second spring loaded electrode may be used engaging the pellet and coaxial with the ring-shaped electrode and the other spring loaded electrode.

The invention also contemplates a method of assembling a semiconductor device comprising securing a diaphragm with an aperture therein by means of insulation to a ring-shaped electrode having a threaded skirt depending therefrom, assembling a spring member on a cylindrical electrode having a flange at one end and inserting the cylindrical electrode through the aperture in the diaghragm, positioning a semiconductor pellet on a base having threaded flange, positioning the flange of the cylindrical electrode on the semiconductor pellet, and screwing the threaded skirt onto the threaded flange on the base to a predetermined torque to compress the spring member and exert a predetermined pressure on the pellet, and securing the diaphragm to the cylindrical electrode.

DRAWINGS

FIG. 1 is a vertical sectional view of a silicon controlled rectifier constructed according to the invention, FIG. 2 is a vertical sectional view of the base pellet assembly, FIG. 3 is a vertical sectional view of the cathode gate tube assembly, FIG. 4 is a vertical sectional view of the anode diaphragm assembly, FIG. 5 is a vertical sectional view showing a subassembly including the cathode gate tube assembly and the anode diaphragm assembly, FIG. 6 is a perspective view of the silicon controlled rectifier shown in FIG. 1 having coaxial terminals, and FIG. 7 is a perspective view of the silicon controlled rectifier having lug type terminals.

DETAILED DESCRIPTION OF THE INVENTION

A semiconductor device constructed according to the invention is shown in FIG. 1 as a silicon controlled rectifier.

The silicon controlled rectifier includes three subassemblies; a base pellet assembly 1 shown in FIG. 2, a cathode gate tube assembly 3 shown in FIG. 3 and an anode diaphragm assembly 5 shown in FIG. 4. The cathode gate tube assembly 3 and the anode diaphragm assembly 5 are assembled into a subassembly shown in FIG. 5 and this subassembly is assembled to the base pellet assembly 1 as shown in FIG. 1.

The base pellet assembly 1 comprises a triangular base 7 having holes 9 at the apices of the angles for attaching the base with screws 10 and bushings 12 to a heat sink (not shown). The base has a planar mounting surface for good heat conduction. An externally threaded flange 11 extends upwardly from the base. A semiconductor pellet 14 is centered in flange 11 on base 7 by an insulating ring 16. An annealed silver wetting wafer 15 serves to wet the pellet-base interface to assure intimate electrical and thermal contact at final assembly.

The cathode gate tube assembly 3 shown in FIG. 3 comprises a cathode tube 17 of copper having a flange 19 at one end. A gate tube 21 of nickel iron is centered in cathode tube 17 and is secured thereto by a compression bonded glass seal 23. A steel tube 25 is soldered or brazed to the inner surface of cathode tube 17 for better adherence of the glass seal 23 and to strengthen the bond.

The anode diaphragm assembly 5 shown in FIG. 4 comprises a relatively thin metallic diaphram 27 with a flanged center 29 having a diameter large enough to fit over cathode tube 17. An anode ring 31 of steel having a cylindrical skirt 30 depending therefrom is arranged concentrically to diaphragm 27 and an annular ceramic insulator 33 metalized on both flat surfaces 34 and 36 is assembled between diaphragm 27 and anode ring 31 and the metalized surfaces are soldered or brazed to the diaphragm and anode ring. The lower portion of cylindrical skirt 30 is threaded at 32 for attachment to flange 11 on base 7. An insulating sleeve 13 is inserted in skirt 30 with one end adjacent insulator 33.

The cathode gate tube assembly 3 and the anode diaphragm assembly 5 are assembled as shown in FIG.

5. A gate nail 37 having a head 38 at one end is inserted through an insulator 39, a short sleeve 41 of insulating material and a compression spring 43 into gate tube 21 of the cathode gate tube assembly. Gate nail head 38 prevents the associated end of the gate nail from passing through insulator 39 and provides an electrical contact with semiconductor pellet 14 as described below. The other end of gate nail 37 is soldered to gate tube 21 as shown at 22.

Two pressure washers 47 and 48 with a Belleville spring 49 therebetween are assembled to cathode gate tube assembly 3 with the lower washer 48 seating on flange 19 of cathode tube 17.

Anode diaphragm assembly 5 then is placed over the cathode gate tube assembly 3 with cathode tube 17 extending through the flanged center 29 of diaphragm 27 and with the diaphragm resting on the uppermost pressure washer 47.

The subassembly shown in FIG. 5 is then assembled to base pellet assembly 1 as shown in FIG. 1. While holding cathode gate tube assembly fixed with gate nail head 38 and flange 19 engaging semiconductor pellet 14, cylindrical skirt 30 on anode ring 31 is threaded to flange 11 on base 7 whereupon the Belleville spring 49, compression spring 43 and insulator 33 are loaded in compression and the portion of gate nail 37 between insulator 39 and gate tube 21 bends to accommodate compression spring 43. The anode ring is torqued to a predetermined value.

Belleville spring 49 and spring 43 under compression urge flange 19 on cathode tube 17 and head 38 on gate nail 37, respectively, into engagement with semiconductor pellet 14 with a predictable load on pellet 14 to insure the cathode tube and gate nail making good contact with semiconductor pellet 14 even though the semiconductor device is exposed to vibration and large changes in temperature. After anode ring is torqued to the predetermined value hermetic solder seals 50 and 51 are made between skirt 30 and base 7 and between cathode tube 17 and diaphragm flange 29. Diaphragm 27 accommodates unequal thermal expansion and contraction of skirt 30 and cathode tube 17.

The coaxial terminals on gate tube 21 and cathode tube 17 shown in FIG. 6 may be used if desired or traditional lug terminals 53 and 55 may be secured to a coaxial gate tube 21 and to cathode tube 17, respectively, as shown in FIG. 7.

The packaging arrangement including soldered connections and coaxial terminals in accordance with the invention simplifies hermetically sealing the device and may be utilized to reduce the weight and size of semiconductor devices carrying large currents where weight and size are prime consideration. The Belleville spring and associated hardware being insulated from the anode and being common with the cathode also facilitates reduction in weight and size.

Torquing anode ring 31 to a predetermined value permits an accurate, predictable load to be applied to semiconductor pellet 14 by Belleville spring 49 to insure cathode tube 17 and gate nail head 38 making good contact with pellet 14 with no danger of overstressing the pellet or damaging the Belleville spring. The semiconductor device accommodates variations in manufacturing tolerances, and the semiconductor device can be disassembled and repaired to replace faulty parts rather than discard the entire semiconductor device which is the only recourse for packages employing metallurgically bonded closures.

While a silicon controlled rectifier having coaxial anode, cathode and gate terminals positioned directly above the semiconductor pellet is shown in the present embodiment, the gate terminal can be eliminated to provide a diode, or any other type semiconductor can be made in accordance with the above invention.

What is claimed is:

1. A method of assembling a semiconductor device comprising securing a diaphragm with an aperture therein by means of insulation to a ring-shaped electrode having a threaded skirt depending therefrom, assembling a spring member on a cylindrical electrode having a flange at one end and inserting the cylindrical electrode through the aperture in the diaphragm with the spring member being positioned between the flange and the diaphragm, positioning a semiconductor pellet on a base having a threaded flange, positioning the flange of the cylindrical electrode on the semiconductor pellet, and screwing the threaded skirt onto the threaded flange on the base to a predetermined torque to compress the spring member and exert a predetermined pressure on the pellet, and securing the diaphragm to the cylindrical electrode.

2. The method described in claim 1 including the steps of assembling a spring loaded electrode coaxial with the cylindrical electrode and insulated therefrom so that the spring loaded electrode contacts and engages the semiconductor pellet under compression when the other two electrodes are assembled to the base.

3. A method of assembling a semiconductor device as described in claim 1 including the step of assembling a wetting wafer between the base and to semiconductor pellet to provide an electrical interface between the base and the pellet.

4. A method of assembling a semiconductor device as described in claim 2 including the steps of hermetically sealing the diaphragm to the cathode tube and hermetically sealing the skirt of the ring shaped electrode to the base.

* * * * *